US012772566B2

(12) United States Patent
Yu et al.

(10) Patent No.: US 12,772,566 B2
(45) Date of Patent: Oct. 20, 2026

(54) DISPLAY PANEL AND DISPLAY DEVICE INCLUDING DRIVE CIRCUIT AND CONTROL CIRCUIT DISPOSED IN NON-DISPLAY AREA

(71) Applicant: Guangzhou China Star Optoelectronics Semiconductor Display Technology Co., LTd., Guangzhou (CN)

(72) Inventors: Jing Yu, Guangzhou (CN); Juan Xiao, Guangzhou (CN)

(73) Assignee: GUANGZHOU CHINA STAR OPTOELECTRONICS SEMICONDUCTOR DISPLAY TECHNOLOGY CO., LTD., Guangzhou (CN)

( * ) Notice: Subject to any disclaimer, the term of this patent is extended or adjusted under 35 U.S.C. 154(b) by 286 days.

(21) Appl. No.: 18/536,135

(22) Filed: Dec. 11, 2023

(65) Prior Publication Data

US 2024/0332317 A1 Oct. 3, 2024

(30) Foreign Application Priority Data

Mar. 30, 2023 (CN) ......................... 202310332513.1

(51) Int. Cl.
*H10D 86/60* (2025.01)
*H10D 86/40* (2025.01)

(52) U.S. Cl.
CPC ........... *H10D 86/60* (2025.01); *H10D 86/443* (2025.01)

(58) Field of Classification Search
CPC .. H10D 86/60; H10D 86/443; G02F 1/13452; G09F 9/30
See application file for complete search history.

(56) References Cited

U.S. PATENT DOCUMENTS

2012/0043545 A1* 2/2012 Kim ..................... H10D 86/441 257/E29.101
2014/0158995 A1* 6/2014 Park ................... H10K 59/1213 257/40
2014/0159034 A1* 6/2014 Yang .................. H10D 30/6729 438/34

(Continued)

FOREIGN PATENT DOCUMENTS

CN 111399290 A 7/2020
CN 111880344 A 11/2020

(Continued)

OTHER PUBLICATIONS

Chinese Office Action issued in corresponding Chinese Patent Application No. 202310332513.1 dated Aug. 18, 2026, pp. 1-9.

*Primary Examiner* — Khiem D Nguyen
(74) *Attorney, Agent, or Firm* — PV IP PC; Christopher S. Ruprecht; Wei Te Chung

(57) ABSTRACT

A display panel having a display area and a non-display area surrounding the display area, and a display device. The display panel includes a drive circuit unit disposed in the non-display area; a control circuit unit disposed in the non-display area; a first metal wire at least partially disposed in the display area; and a second metal wire disposed in the non-display area and electrically connecting the drive circuit unit with the control circuit unit. A thickness of the second metal wire is greater than a thickness of the first metal wire.

18 Claims, 4 Drawing Sheets

(56) References Cited

U.S. PATENT DOCUMENTS

| | | | | |
|---|---|---|---|---|
| 2015/0187279 A1* | 7/2015 | Lee | G09G 3/3225 | |
| | | | 438/23 | |
| 2019/0267444 A1* | 8/2019 | Moon | H10K 59/8791 | |

FOREIGN PATENT DOCUMENTS

| | | |
|---|---|---|
| CN | 114080671 A | 2/2022 |
| CN | 114531915 A | 5/2022 |

* cited by examiner

DISPLAY PANEL AND DISPLAY DEVICE INCLUDING DRIVE CIRCUIT AND CONTROL CIRCUIT DISPOSED IN NON-DISPLAY AREA

CROSS-REFERENCE TO RELATED APPLICATION

This application claims priority to and the benefit of Chinese Patent Application No. 202310332513.1, filed on Mar. 30, 2023, the disclosure of which is incorporated herein by reference in its entirety.

TECHNICAL FIELD

The present disclosure relates to the field of display technologies, and more particularly, to a display panel and a display device.

BACKGROUND

At present, high-frequency display is one of the research hotspots of display technologies. However, high-frequency display requires higher performance of display devices.

Therefore, it is necessary to propose a technical solution to ensure that display devices are capable of implementing high-frequency display, which is a technical problem to be solved.

SUMMARY

In an aspect of the present disclosure, provided is a display panel having a display area and a non-display area surrounding the display area. The display panel includes a drive circuit unit disposed in the non-display area; a control circuit unit disposed in the non-display area; a first metal wire at least partially disposed in the display area; and a second metal wire disposed in the non-display area and electrically connecting the drive circuit unit with the control circuit unit; where a thickness of the second metal wire is greater than a thickness of the first metal wire.

In another aspect of the present disclosure, provided is a display device includes a display panel. The display panel has a display area and a non-display area surrounding the display area. The display panel includes a drive circuit unit disposed in the non-display area; a control circuit unit disposed in the non-display area; a first metal wire at least partially disposed in the display area; and a second metal wire disposed in the non-display area and electrically connecting the drive circuit unit with the control circuit unit; where a thickness of the second metal wire is greater than a thickness of the first metal wire.

DETAILED DESCRIPTION

The technical solutions in the embodiments of the present disclosure will be clearly and completely described below with reference to the accompanying drawings related to the embodiments of the present disclosure. Apparently, the described embodiments are only some of the embodiments of the present disclosure, but not all of the embodiments. Based on the embodiments in the present disclosure, all other embodiments obtained by those skilled in the art without making creative efforts fall within the scope of protection of the present disclosure.

For a display device which needs to be operated at a high refresh frequency, the Applicant has found, on the basis of extensive industry experience and extensive experimental demonstration, that, to ensure a high refresh frequency of the display device, it is necessary to reduce resistances of wirings for transmitting high-frequency signals. However, the wirings of the display panel include various wirings in a display area and various wirings in a non-display area. After further study, it has been found that resistances of peripheral wirings connecting a drive chip and a printed circuit board are one of the most key factors for high-frequency display, mainly because the high-frequency signals are transmitted to the panel from the peripheral wirings connecting the drive chip and the printed circuit board, and it is more important to ensure, from an input end of the high-frequency signals, the transmission of the high-frequency signals.

Based on the above findings, the Applicant increases a thickness of a metal layer in which peripheral wirings connecting a drive chip and a printed circuit board is located to increase the thickness of the peripheral wirings connecting the drive chip and the printed circuit board. However, an increase in the thickness of the metal layer also results in an increase in a thickness of metal wirings in a display area, increasing the risk of an insulating layer in the display area being damaged, and further increasing the risk of the metal wirings being short-circuited due to the insulating layer being damaged.

Therefore, the thickness of the metal wirings located in the display area is made by the Applicant smaller than the thickness of the peripheral wirings connecting the drive chip and the printed circuit board, so as to increase the thickness of the peripheral wirings connecting the drive chip and the printed circuit board, and reduce the resistances of the peripheral wirings connecting the drive chip and the printed circuit board, so as to ensure that display devices are capable of high-frequency display. Moreover, the smaller thickness of the wirings of the display area is more favorable for reducing the risk of the insulation layer in the display area being damaged due to a thicker thickness of the wirings in the display area, and in turn alleviating the problem that the wirings of the display area are short-circuited due to a damaged insulation layer in the display area.

Figure 1:
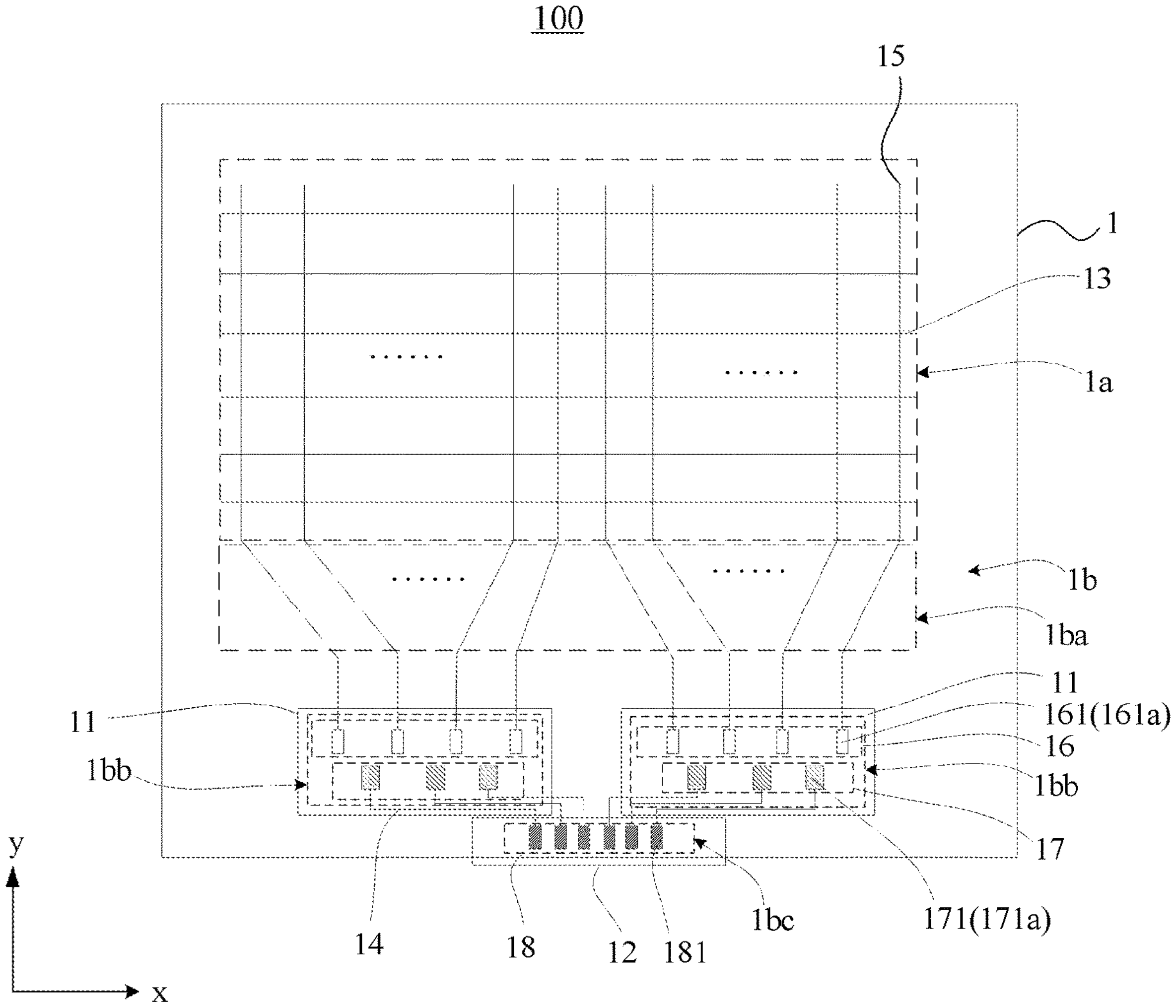
FIG. 1 is a schematic plan view of a display device according to an embodiment of the present disclosure.

Referring to FIG. 1, there is shown a schematic plan view of a display device according to an embodiment of the present disclosure.

The display device 100 is compatible with functions of high-frequency display and low frequency-display. A refresh frequency of the display device 100 is greater than or equal to 10 Hz and less than or equal to 400 Hz. When the display device 100 is in a high-frequency display mode, the refresh frequency of the display device 100 is greater than or equal to 120 Hz, for example, the refresh frequency of the display device 100 is 120 Hz, 144 Hz, 165 Hz, or 240 Hz. When the display device 100 is in a low-frequency display mode, the refresh frequency of the display device 100 is less than 120

Hz, for example, the refresh frequency of the display device 100 is 10 Hz, 20 Hz, or 30 Hz.

The display device 100 is any one of a liquid crystal display device, an organic light-emitting diode display device, a quantum dot display device, a miniature light-emitting diode display device, or a sub-millimeter light-emitting diode display device. The technical solution of the present disclosure is described below in conjunction with the display device 100 being a liquid crystal display device, but is not limited thereto.

As shown in FIG. 1, in the embodiments of the present disclosure, the display device 100 includes a display panel 1 and a backlight module (not shown), and the display panel 1 is located on a light-emitting side of the backlight module.

In the embodiments of the present disclosure, the display panel 1 has a display area 1*a* and a non-display area 1*b* surrounding the display area 1*a*. The display panel 1 includes a drive circuit unit 11, a control circuit unit 12, a plurality of first metal wires 13, a plurality of second metal wires 14, and a plurality of third metal wires 15.

In the embodiments of the present disclosure, each of the first metal wire 13 is a scan line. That is, the first metal wires 13 are configured to transmit scanning signals. Each of the third metal wire 15 is a data line. That is, the third metal wires 15 are configured to transmit data signals.

In other embodiments, the first metal wires 13 may also be data lines and the third metal wires 15 may be scan lines.

In the embodiments of the present disclosure, at least part of the plurality of first metal wires 13 and at least part of the plurality of third metal wires 15 are disposed in the display area 1*a*. That is, the plurality of first metal wires 13 and the plurality of third metal wires 15 are mainly disposed in the display area 1*a*. The plurality of first metal wires 13 and the plurality of third metal wires 15 are insulated from each other, and the plurality of first metal wires 13 intersect with the plurality of third metal wires 15. The plurality of first metal wires 13 and the plurality of third metal wires 15 may be located in different metal layers, but are not limited thereto. The plurality of first metal wires 13 and the plurality of third metal wires 15 may also be located in a same metal layer.

Specifically, the plurality of first metal wires 13 and the plurality of third metal wires 15 each extend from the display area 1*a* to the non-display area 1*b*, and the plurality of first metal wires 13 and the plurality of third metal wires 15 are located in different metal layers. The plurality of first metal wires 13 each extend in a first direction x and are arranged in parallel and at intervals in a second direction y. The plurality of third metal wires 15 each extend in the second direction y and are arranged in parallel and at intervals in the first direction x. The first direction x is perpendicular to the second direction y such that each of the first metal wires 13 and each of the third metal wires 15 are perpendicular to each other.

In the embodiments of the present disclosure, the non-display area 1*b* includes a sector wiring area 1*ba*, a first bonding area 1*bb*, and a second bonding area 1*bc*. In the second direction y, the sector wiring area 1*ba* is located on one side of the display area 1*a*, and the first bonding area 1*bb* and the second bonding area 1*bc* are both located on one side of the sector wiring area 1*ba* away from the display area 1*a*.

In the embodiments of the present disclosure, the drive circuit unit 11 is a drive integrated circuit (IC), and is configured to output data signals. The drive circuit unit 11 is bonded to the first bonding area 1*bb* of the non-display area 1*b*. The plurality of third metal wires 15 extend from the display area 1*a* through the sector wiring area 1*ba* to the first bonding area 1*bb* and are electrically connected to the drive circuit unit 11 so as to output the data signals output by the drive circuit unit 11 to the plurality of third metal wires 15.

In the embodiments of the present disclosure, the number of the first bonding areas 1*bb* is the same as the number of the drive circuit units 11. The number of the drive circuit units 11 is one, two or more. When the number of the drive circuit units 11 is a plurality, the drive circuit units 11 are arranged side by side in the first direction x.

In the embodiments of the present disclosure, the display panel 1 further includes a first pin group 16 and a second pin group 17 located in each first bonding area 1*bb*.

In the embodiments of the present disclosure, each first pin group 16 includes a plurality of first bonding pins 161 for outputting the data signals to the third metal wires 15. The plurality of first bonding pins 161 form at least one row of the first bonding pins, each row of the first bonding pins including at least two first bonding pins 161 arranged side by side and at an interval in a first direction x. The plurality of first bonding pins 161 are electrically connected to the plurality of third metal wires 15 on a one-to-one basis. Each of the first bonding pins 161 has a first bonding surface 161*a* facing the drive circuit unit 11.

Specifically, as shown in FIG. 1, in each first bonding area 1*bb*, the plurality of first bonding pins 161 of each first pin group 16 form a row of the first bonding pins, and the plurality of first bonding pins 161 of the row of the first bonding pins 161 are arranged side by side and at intervals in the first direction x.

In the embodiments of the present disclosure, in the second direction y, the second pin groups 17 are provided on one side of the first pin groups 16 away from the display area 1*a* to simplify wiring in the non-display area 1*b* of the display panel 1.

It will be appreciated that in other embodiments, in the first direction x, the second pin groups 17 may also be arranged side by side with the first pin groups 16.

In the embodiments of the present disclosure, each second pin group 17 includes a plurality of second bonding pins 171 for transmitting signals output from the control circuit unit 12 to the driver circuit unit 11. The plurality of second bonding pins 171 form a row of the second bonding pins, and the plurality of second bonding pins 171 of the row of the second bonding pins are arranged side by side and at intervals in the first direction x. Each second bonding pin 171 has a second bonding surface 171*a* facing the drive circuit unit 11. The plurality of second metal wires 14 located in the non-display area 1*b* are connected to the plurality of second bonding pins 171, and the plurality of second metal wires 14 are electrically connected to the control circuit unit 12.

In the embodiments of the present disclosure, the drive circuit unit 11 is bonded onto the second bonding surfaces 171*a* and the first bonding surfaces 161*a* by a first conductive connector (not shown), such that the drive circuit unit 11 is bonded to the first bonding area 1*bb*. The first conductive connector includes at least one of an anisotropic conductive adhesive or conductive adhesive film.

Since the plurality of second metal wires 14 are electrically connected to the control circuit unit 12 and the plurality of second bonding pins 171, the drive circuit unit 11 is bonded onto the second bonding surface 171*a* such that the plurality of second metal wires 14 are electrically connected to the drive circuit unit 11 and the control circuit unit 12.

Note that the drive circuit unit 11 further includes a plurality of first output pins (not shown) bonded to the plurality of first bonding pin 161 and a plurality of input pins (not shown) bonded to the plurality of second bonding pin 171.

In the embodiments of the present disclosure, the plurality of second metal wires 14 are connected to the plurality of second bonding pins 171 on a one-to-one basis.

In other embodiments, one of the second metal wires 14 may also be connected to at least two of the second bonding pins 171 such that the one of the second metal wires 14 transmits a same signal to the at least two of the second bonding pins 171, thereby increasing a bonding area between the second bonding pins 171 transmitting the same signal and the drive circuit unit 11, increasing the speeds at which the signals output by the control circuit unit 12 are transmitted from the second metal wires 14 to the drive circuit unit 11 via the second bonding pins 171, and satisfying the impedance requirements of the display device 100 for realizing high-frequency driving.

In the embodiments of the present disclosure, a thickness of the second bonding pins 171 is the same as a thickness of the first bonding pins 161, so as to ensure that the driving circuit unit 11 can be bonded flatly on the display panel 1 to avoid warping of the driving circuit unit 11 after being bonded onto the display panel 1 and causing abnormal display problems.

In the embodiments of the present disclosure, an area of each second bonding surface 171*a* is greater than an area of each first bonding surface 161*a*, so as to increase the bonding area between the second bonding pins 171 and the drive circuit unit 11, reduce the contact impedance between the second bonding pins 171 and the drive circuit unit 11, increase the speed at which the signals output by the control circuit unit 12 is transmitted from the second metal wires 14 to the drive circuit unit 11 via the second bonding pins 171, and further satisfy the impedance requirements of the display device 100 for realizing high-frequency driving.

In the embodiments of the present disclosure, the control circuit unit 12 supplies power supply signals, differential signals, and ground signals to the drive circuit unit 11 through the plurality of second metal wires 14. The control circuit unit 12 is a flexible printed circuit board (FPC) including a flexible substrate and a control chip disposed on the flexible substrate. The control circuit unit 12 is bonded to the second bonding area 1*bc*.

Note that when the display device 100 needs to be driven at a high frequency, the transmission speed of the power supply signals is required to be very high, and the requirement of the power supply signal for resistance is relatively high, such that reducing the impedances of the second metal wires 14 facilitates shortening the transmission time of the power supply signal.

In the embodiments of the present disclosure, one second bonding area 1*bc* is located on one side of two first bonding areas 1*bb* away from the display area 1*a*. In the first direction x, two first bonding areas 1*bb* are symmetrically disposed on opposite sides of one second bonding area 1*bc*. In the second direction y, the distances between the two first bonding areas 1*bb* and one second bonding area 1*bc* are the same to ensure that signals output by the control circuit unit 12 can be synchronously output to the two drive circuit units 11 bonded to the two first bonding areas 1*bb*.

In other embodiments, in the first direction x, the second bonding area 1*bc* may also be disposed side by side with the first bonding area 1*bb*. The number of the second bonding areas 1*bc* may also be a plurality. For example, the number of the second bonding areas 1*bc* is two, the two second bonding areas 1*bc* are disposed side by side with one first bonding area 1*bb*, and the two second bonding areas 1*bc* are symmetrically located on opposite sides of the one first bonding area 1*bb* in the first direction x.

The display panel 1 further includes a third pin group 18 located in the second bonding area 1*bc*, the third pin group 18 including a plurality of third bonding pins 181, the plurality of third bonding pins 181 being spaced apart and arranged side by side in the first direction x. The control circuit unit 12 is bonded to the plurality of third bonding pins 181 by a second conductive connector (not shown) including at least one of an anisotropic conductive adhesive or conductive adhesive film.

It should be noted that the control circuit unit 12 further includes second output pins (not shown) disposed one-to-one with the third bonding pins 181.

In the embodiments of the present disclosures, the thickness of the second metal wires 14 is greater than the thickness of the first metal wires 13. Since the second metal wires 14 are electrically connected to the drive circuit unit 11 and the control circuit unit 12, the thickness of the second metal wires 14 is greater than the thickness of the first metal wire 13, and the thickness of the second metal wires 14 is thicker and the thickness of the first metal wires 13 is thinner, it is ensured that a resistances of the second metal wires 14 are smaller, so as to shorten the transmission time of signals between the drive circuit unit 11 and the control circuit unit 12, thereby ensuring that the display panel 1 is compatible with a low-frequency display function and a high-frequency display function, while reducing the risk of an insulating layer in the display area 1*a* being easily damaged due to a thicker thickness of the first metal wires 13, and in turn reducing the risk of wires in the display area 1*a* being short-circuited due to a damaged insulating layer, thus improving a display effect of the display device.

In the embodiments of the present disclosure, the thickness of the second metal wires 14 is also greater than that of the third metal wires 15, so as to further reduce the risk of the insulating layer of the display area 1*a* being easily damaged, thereby reducing the risk of the wires of the display area 1*a* being short-circuited due to a damaged insulating layer, thus improving the display effect of the display device.

In the embodiments of the present disclosure, the thickness of the second metal wires 14 is greater than the thicknesses of all metal wires located in the display area 1*a* to minimize the risk of the insulating layer of the display area 1*a* being damaged.

Further, in the embodiments of the present disclosure, the thickness of the second metal wires 14 is greater than the thicknesses of all metal wires of the display area 1*a* and the thicknesses of other metal wires than the second metal wires 14 in the non-display area 1*b*. That is, the thickness of the second metal wires 14 is greater than the thicknesses of other metal wires on the display panel 1.

In the embodiments of the present disclosure, the first metal wires 13 and the third metal wires 15 have different thicknesses. For example, the thickness of the first metal wires 13 is smaller than the thickness of the third metal wires 15 to reduce the impedances of the third metal wires 15. Alternatively, the thickness of the first metal wires 13 is greater than the thickness of the third metal wires 15 to reduce the impedances of the first metal wires 13.

In the embodiments of the present disclosure, the thicknesses of the first metal wires 13 and the third metal wires 15 are greater than or equal to 1000 Angstroms and less than or equal to 5000 Angstroms. For example, the thickness of the first metal wires 13 is 1500 Angstroms, 1800 Angstroms, 2000 Angstroms, 2400 Angstroms, 2800 Angstroms, 3200 Angstroms, 3600 Angstroms, 4000 Angstroms, or 4500 Angstroms, and the thickness of the third metal wires 15 is 1500 Angstroms, 1800 Angstroms, 2000 Angstroms, 2400 Angstroms, 2800 Angstroms, 3200 Angstroms, 3600 Angstroms, 4000 Angstroms, or 4500 Angstroms.

In the embodiments of the present disclosure, the thickness of the second metal wires 14 is greater than or equal to 3000 Angstroms and less than or equal to 6000 Angstroms. For example, the thickness of the second metal wires 14 is 3000 Angstroms, 3200 Angstroms, 3400 Angstroms, 3600 Angstroms, 3800 Angstroms, 4000 Angstroms, 4200 Angstroms, 4400 Angstroms, 4800 Angstroms, 5000 Angstroms, 5200 Angstroms, 5500 Angstroms, 5800 Angstroms, or 6000 Angstroms.

Figure 2:
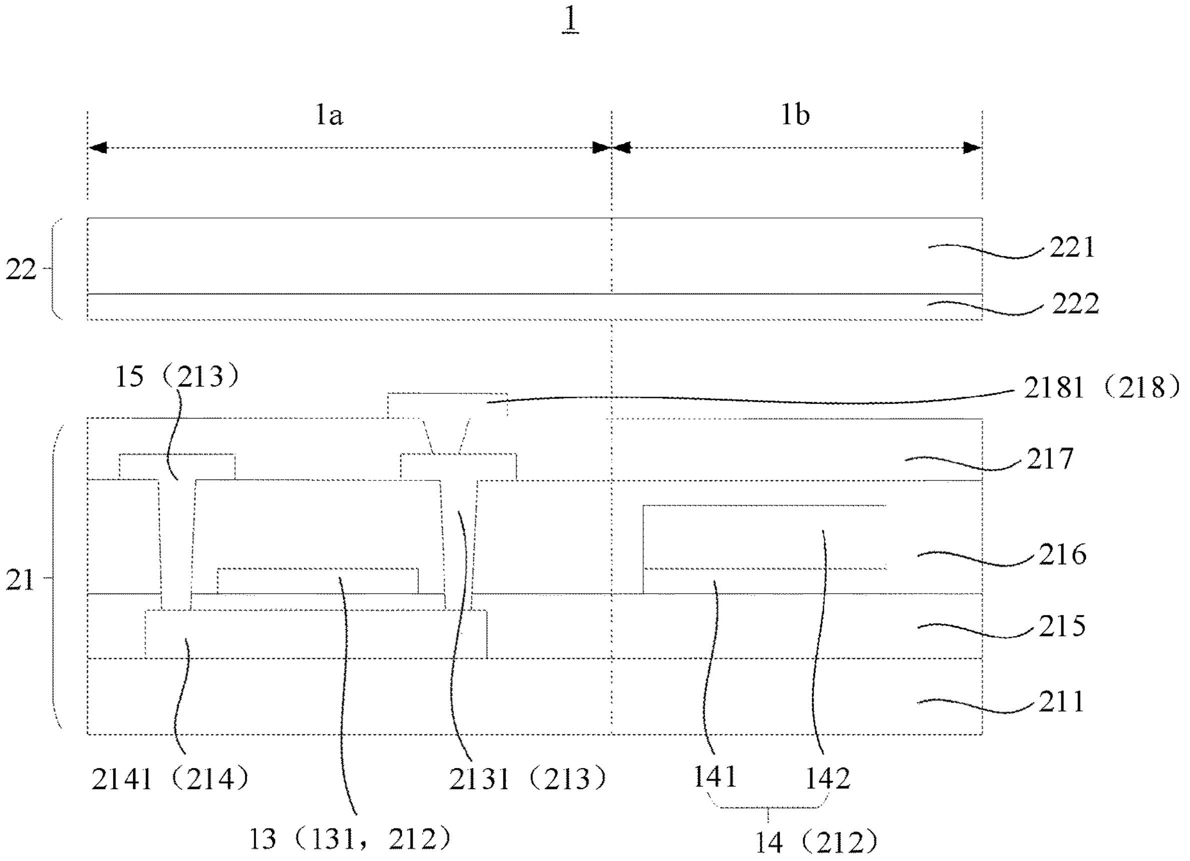
FIG. 2 is a schematic cross-sectional view of a display device according to an embodiment of the present disclosure.

Referring to FIG. 2, there is shown a cross-sectional view of a display device according to an embodiment of the present disclosure. The display panel 1 includes an array substrate 21 and a counter substrate 22. The array substrate 21 and the counter substrate 22 are arranged opposite to each other. The array substrate 21 includes an underlayer 211, a first metal layer 212, a second metal layer 213, a semiconductor layer 214, a first insulating layer 215, a second insulating layer 216, a third insulating layer 217, and a pixel electrode layer 218. The counter substrate 22 includes a counter underlayer 221 and a common electrode 222 disposed on a surface of the counter underlayer 221 adjacent to the array substrate 21.

In the embodiments of the present disclosure, the semiconductor layer 214 is disposed on a surface of the underlayer 211 adjacent to the counter substrate 22. The first insulating layer 215 covers the semiconductor layer 214 and the underlayer 211. The first metal layer 212 is disposed on a surface of the first insulating layer 215 away from the underlayer 211. The second insulating layer 216 covers the first metal layer 212 and the first insulating layer 215. The second metal layer 213 is disposed on a surface of the second insulating layer 216 away from the underlayer 211. The third insulating layer 217 covers the second metal layer 213 and the second insulating layer 216. The pixel electrode layer 218 is disposed on a surface of the third insulating layer 217 away from the underlayer 211.

In other embodiments, the first metal layer 212 may also be disposed on a surface of the underlayer 211 adjacent to the counter substrate 22. The first insulating layer 215 covers the first metal layer 212 and the underlayer 211. The semiconductor layer 214 is disposed on a surface of the first insulating layer 215 away from the underlayer 211. The second insulating layer 216 covers the semiconductor layer 214 and the first insulating layer 215. The second metal layer 213 is disposed on a surface of the second insulating layer 216 away from the underlayer 211. The third insulating layer 217 covers the second metal layer 213 and the second insulating layer 216. The pixel electrode layer 218 is disposed on a surface of the third insulating layer 217 away from the underlayer 211.

In the embodiments of the present disclosure, the semiconductor layer 214 includes an active layer 2141. The first metal layer 212 includes a first metal wire 13 and a second metal wire 14. That is, the first metal wire 13 and the second metal wire 14 are located on the same metal layer. The second metal layer 213 includes a third metal wire 15 and a drain electrode 2131. That is, the second metal wire 14 and the third metal wire 15 are located at different metal layers. The pixel electrode layer 218 includes a pixel electrode 2181 electrically connected to the drain electrode 2131 through a via penetrating the third insulating layer 217.

In other embodiments, the first metal layer 212 may also include a first metal wire 13, and the second metal layer 213 includes a third metal wire 15, a drain electrode 2131, and a second metal wire 14. That is, the second metal wire 14 and the third metal wire 15 are located in the same metal layer.

Note that in the present disclosure, different metal layers are separated by an insulating layer. There is a distinct film interface between different metal films.

In the embodiments of the present disclosure, in the case where the first metal wire 13 and the second metal wire 14 are located in the same metal layer, the number of metal films of the second metal wire 14 is greater than the number of metal film(s) of the first metal wire 13, such that the thickness of the second metal wire 14 is greater than the thickness of the first metal wire 13.

In other embodiments, it is also possible that the first metal wire 13 and the second metal wire 14 are located at different metal layers, and the number of metal films of the second metal wire 14 is greater than the number of metal film(s) of the first metal wire 13, such that the thickness of the second metal wire 14 is greater than the thickness of the first metal wire 13.

In other embodiments, in the case where the third metal wire 15 and the second metal wire 14 are located in the same metal layer, the number of metal films of the third metal wire 15 is greater than the number of metal film(s) of the first metal wire 13, such that the thickness of the third metal wire 15 is greater than the thickness of the first metal wire 13.

In other embodiments, it is also possible that the number of metal film(s) of the second metal wire 14 is equal to the number of metal film(s) of the first metal wire 13, and the thickness of at least one metal film of the second metal wire 14 is smaller than the thickness of at least one metal film of the first metal wire 13. For example, the second metal wire 14 and the first metal wire 13 each include a copper film, and the thickness of the second metal wire 14 is greater than that of the first metal wire 13.

In the embodiments of the present disclosure, at least a portion of the first metal wire 13 and at least a portion of the second metal wire 14 are located in the same metal film and include the same material, such that at least a portion of the first metal wire 13 and at least a portion of the second metal wire 14 are located in the same metal layer, thereby facilitating the patterning of a metal layer with a halftone mask to obtain the first metal wire 13 and the second metal wire 14 having different thicknesses, thereby simplifying the manufacturing process of the display device 100.

Specifically, the first metal wire 13 includes a first lower metal film 131. That is, the first metal wire 13 includes one metal film. The second metal wire 14 includes a second lower metal film 141 and a second upper metal film 142. The second upper metal film 142 and the second lower metal film 141 are stacked. The second upper metal film 142 is located on a surface of the second lower metal film 141 away from the underlayer 211. The material of the second upper metal film 142 is different from the material of the second lower metal film 141. That is, the second metal wire 14 includes two metal films. The first lower metal film 131 and the second lower metal film 141 are located in the same metal film and include the same material, and the thickness of the first lower metal film 131 is equal to that of the second lower metal film 141.

In the embodiments of the present disclosure, the electrical conductivity of the material of the second upper metal film 142 is smaller than that of the material of the second lower metal film 141, such that the first lower metal film 131 and the second lower metal film 141 have better electrical conductivity and the resistance of the second metal wire 14 is reduced, while ensuring that the first metal wire 13 has good electrical conductivity.

The material of the second upper metal film 142 and the material of the second lower metal film 141 are each selected from at least one of molybdenum, aluminum, titanium, copper, and silver. For example, the material of the second upper metal film 142 is molybdenum, and the material of the second lower metal film 141 is copper.

In the embodiments of the present disclosure, the thickness of the second upper metal film 142 is greater than the thickness of the second lower metal film 141 to further reduce the impedance of the second metal wire 14.

Figure 3:
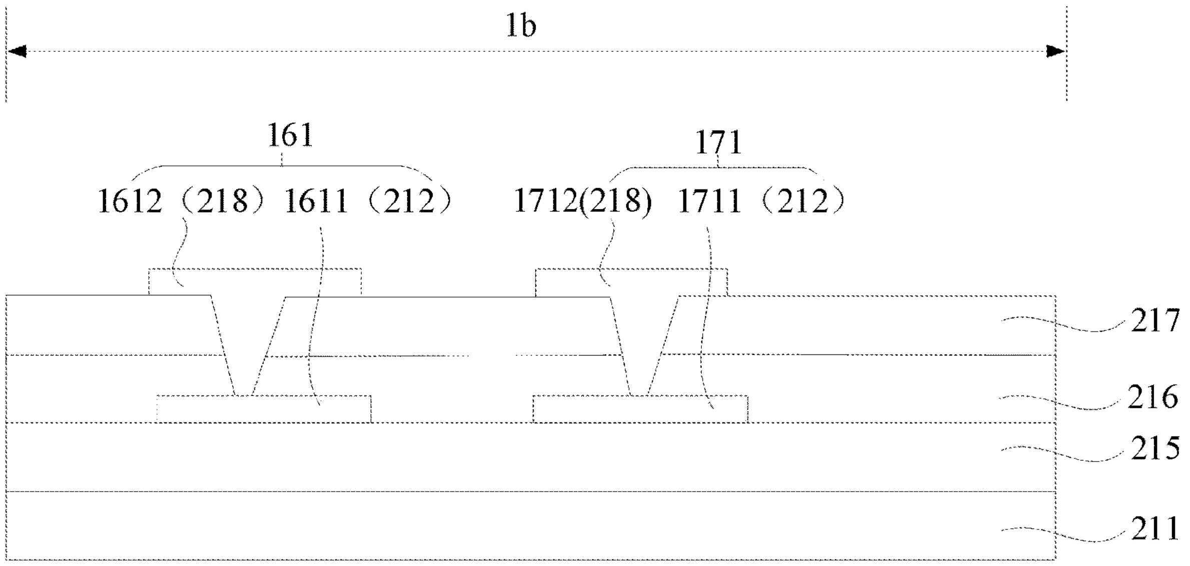
FIG. 3 is a schematic cross-sectional view of a display panel in a non-display area according to an embodiment of the present disclosure.
Figure 4:
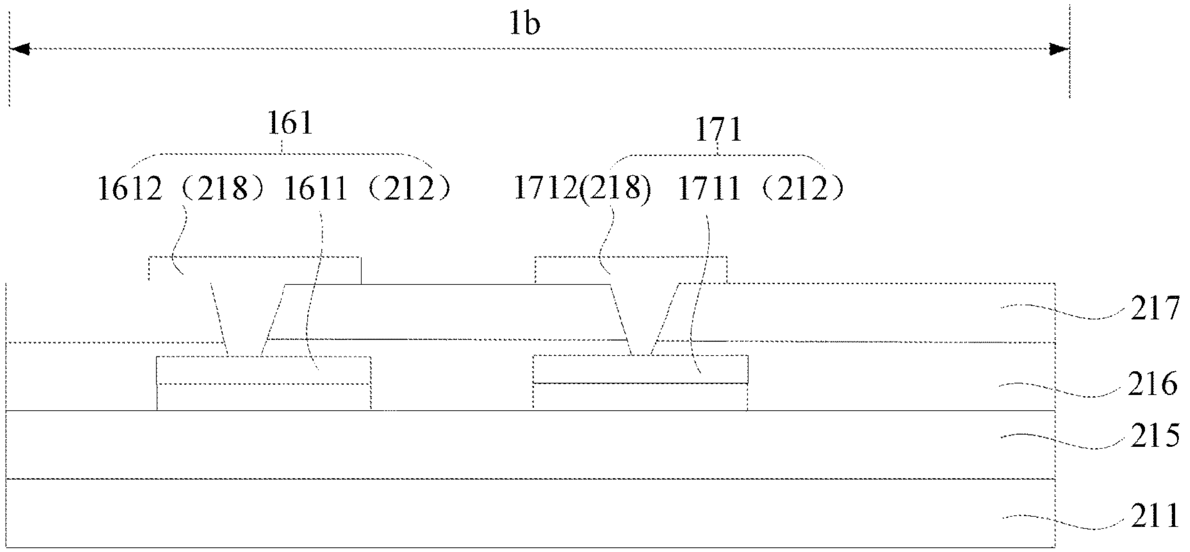
FIG. 4 is a schematic cross-sectional view of another display panel in a non-display area according to an embodiment of the present disclosure.

Referring to FIGS. 3 and 4, FIG. 3 is a first schematic cross-sectional view of a display panel in a non-display area according to an embodiment of the present disclosure; and FIG. 4 is a second schematic cross-sectional view of a display panel in a non-display area according to an embodiment of the present disclosure.

A first bonding pin 161 includes a first metal portion 1611 and a first transparent conductive portion 1612. The first metal layer 212 includes the first metal portion 1611. The pixel electrode layer 218 includes the first transparent conductive portion 1612. The first transparent conductive portion 1612 contacts the first metal portion 1611 through a first via penetrating the second insulating layer 216 and the third insulating layer 217. A second bonding pin 171 includes a second metal portion 1711 and a second transparent conductive portion 1712. The first metal layer 212 includes the second metal portion 1711. The pixel electrode layer 218 includes the second transparent conductive portion 1712. The second transparent conductive portion 1712 contacts the second metal portion 1711 through the second via penetrating the second insulating layer 216 and the third insulating layer 217.

Referring to both FIGS. 2 and 3, the first metal portion 1611, the second metal portion 1711, and the first metal wire 13 each include a first metal film. That is, the first metal portion 1611, the second metal portion 1711, and the first metal wire 13 are composed of the same metal film. The second metal wire 14 includes a first metal film and a second metal film that are stacked. The material of the first metal film is different from the material of the second metal film.

Referring to both FIGS. 2 and 4, the first metal portion 1611, the second metal portion 1711, and the second metal wire 14 each include a first metal film and a second metal film. The material of the first metal film is different from the material of the second metal film. The first metal wire 13 includes the first metal film.

In the embodiments of the present disclosure, the material of the first metal film is copper, but is not limited thereto. The material of the first metal film may be any one of aluminum, molybdenum, and silver. The material of the second metal film is molybdenum, but is not limited thereto. The material of the second metal film may also be aluminum or other materials.

Note that when the display device 100 is a liquid crystal display device, a liquid crystal layer (not shown) is further provided between the array substrate 21 and the counter substrate 22. When the display device 100 is an organic light-emitting diode display device or a quantum dot display device, the counter substrate 22 may be a package substrate. When the display device 100 is a miniature light-emitting diode display device or a sub-millimeter light-emitting diode display device, the display device 100 may have the counter substrate 22 on which a color filter layer or the like is disposed, or the display device 100 may not have the counter substrate 22.

The above description of the embodiments is merely intended to assist in understanding the technical solution of the present disclosure and the core concepts thereof. It will be appreciated by those of ordinary skill in the art that modifications may still be made to the technical solutions described in the foregoing embodiments, or equivalent substitutions may be made to some of the technical features therein. These modifications or substitutions do not depart the essence of the corresponding technical solutions from the scope of the technical solutions of the embodiments of the present disclosure.

What is claimed is:

1. A display panel having a display area and a non-display area surrounding the display area, the display panel comprising:

a drive circuit unit disposed in the non-display area;

a control circuit unit disposed in the non-display area;

a first metal wire at least partially disposed in the display area; and a second metal wire disposed in the non-display area and electrically connecting the drive circuit unit with the control circuit unit;

wherein a thickness of the second metal wire is greater than a thickness of the first metal wire;

the display panel further comprises:

a first bonding pin disposed in the non-display area and having a first bonding surface facing the drive circuit unit; and a second bonding pin disposed in the non-display area, connected to the second metal wire, and having a second bonding surface facing the drive circuit unit; and wherein the drive circuit unit is bonded onto the second bonding surface and the first bonding surface, and an area of the second bonding surface is greater than an area of the first bonding surface.

2. The display panel of claim 1, wherein number of metal films of the second metal wire is greater than number of metal film(s) of the first metal wire.

3. The display panel of claim 1, wherein at least a portion of the first metal wire and at least a portion of the second metal wire are located in a same metal film and comprise a same material.

4. The display panel of claim 2, wherein at least a portion of the first metal wire and at least a portion of the second metal wire are located in a same metal film and comprise a same material.

5. The display panel of claim 1, wherein the first metal wire comprises a first lower metal film;

the second metal wire comprises a second lower metal film and a second upper metal film, the second upper metal film and the second lower metal film are stacked, and a material of the second upper metal film is different from a material of the second lower metal film; and wherein the first lower metal film and the second lower metal film are located in a same metal film and comprise a same material.

6. The display panel of claim 1, wherein the first bonding pin comprises a first metal portion and the second bonding pin comprises a second metal portion; and wherein the first metal portion, the second metal portion, and the first metal wire each comprise a first metal film, and the second metal wire comprises the first metal film and a second metal film, and a material of the first metal film is different from a material of the second metal film.

7. The display panel of claim 1, wherein the first bonding pin comprises a first metal portion and the second bonding pin comprises a second metal portion;

wherein the first metal portion, the second metal portion, and the second metal wire each comprise a first metal film and a second metal film, and a material of the first metal film is different from a material of the second metal film; and wherein the first metal wire comprises the first metal film.

8. The display panel of claim 1, wherein a thickness of the second bonding pin is same as a thickness of the first bonding pin.

9. The display panel of claim 1, wherein the thickness of the first metal wire is greater than or equal to 1000 Angstroms and less than or equal to 5000 Angstroms, and the thickness of the second metal wire is greater than or equal to 3000 Angstroms and less than or equal to 6000 Angstroms.

10. A display device comprising a display panel, the display panel having a display area and a non-display area surrounding the display area, the display panel comprising:

a drive circuit unit disposed in the non-display area;

a control circuit unit disposed in the non-display area;

a first metal wire at least partially disposed in the display area; and a second metal wire disposed in the non-display area and electrically connecting the drive circuit unit with the control circuit unit;

wherein a thickness of the second metal wire is greater than a thickness of the first metal wire;

the display panel further comprises:

a first bonding pin disposed in the non-display area and having a first bonding surface facing the drive circuit unit; and a second bonding pin disposed in the non-display area, connected to the second metal wire, and having a second bonding surface facing the drive circuit unit; and wherein the drive circuit unit is bonded onto the second bonding surface and the first bonding surface, and an area of the second bonding surface is greater than an area of the first bonding surface.

11. The display device of claim 10, wherein number of metal films of the second metal wire is greater than number of metal film(s) of the first metal wire.

12. The display device of claim 10, wherein at least a portion of the first metal wire and at least a portion of the second metal wire are located in a same metal film and comprise a same material.

13. The display device of claim 11, wherein at least a portion of the first metal wire and at least a portion of the second metal wire are located in a same metal film and comprise a same material.

14. The display device of claim 10, wherein the first metal wire comprises a first lower metal film;

the second metal wire comprises a second lower metal film and a second upper metal film, the second upper metal film and the second lower metal film are stacked, and a material of the second upper metal film is different from a material of the second lower metal film; and wherein the first lower metal film and the second lower metal film are located in a same metal film and comprise a same material.

15. The display device of claim 10, wherein the first bonding pin comprises a first metal portion and the second bonding pin comprises a second metal portion; and wherein the first metal portion, the second metal portion, and the first metal wire each comprise a first metal film, and the second metal wire comprises the first metal film and a second metal film, and a material of the first metal film is different from a material of the second metal film.

16. The display device of claim 10, wherein the first bonding pin comprises a first metal portion and the second bonding pin comprises a second metal portion;

wherein the first metal portion, the second metal portion, and the second metal wire each comprise a first metal film and a second metal film, and a material of the first metal film is different from a material of the second metal film; and wherein the first metal wire comprises the first metal film.

17. The display device of claim 10, wherein a thickness of the second bonding pin is same as a thickness of the first bonding pin.

18. The display device of claim 10, wherein the thickness of the first metal wire is greater than or equal to 1000 Angstroms and less than or equal to 5000 Angstroms, and the thickness of the second metal wire is greater than or equal to 3000 Angstroms and less than or equal to 6000 Angstroms.

* * * * *